United States Patent [19]

Shiratake et al.

[11] Patent Number: 5,801,427
[45] Date of Patent: Sep. 1, 1998

[54] SEMICONDUCTOR DEVICE HAVING A POLYCIDE STRUCTURE

[75] Inventors: Shigeru Shiratake; Kaoru Motonami; Satoshi Hamamoto, all of Hyogo, Japan

[73] Assignee: Mitsubishi Denki Kabushiki Kaisha, Tokyo, Japan

[21] Appl. No.: 873,027

[22] Filed: Jun. 11, 1997

Related U.S. Application Data

[63] Continuation of Ser. No. 563,421, Nov. 28, 1995, abandoned.

[30] Foreign Application Priority Data

May 26, 1995 [JP] Japan ............................. 7-128066

[51] Int. Cl.$^6$ .......................... H01L 29/94; H01L 31/062
[52] U.S. Cl. .......................... 257/412; 257/413; 257/623; 257/754; 257/755
[58] Field of Search .......................... 257/412, 413, 257/623, 754, 755

[56] References Cited

U.S. PATENT DOCUMENTS

| | | | |
|---|---|---|---|
| 4,128,670 | 12/1978 | Gaensslen | 257/413 |
| 5,276,347 | 1/1994 | Wei et al. | 257/412 |
| 5,424,572 | 6/1995 | Solheim | 257/412 |
| 5,448,094 | 9/1995 | Hsu | 257/330 |
| 5,585,659 | 12/1996 | Kobayashi et al. | 257/371 |
| 5,600,177 | 2/1997 | Yamazaki | 257/588 |
| 5,640,035 | 6/1997 | Sudo et al. | 257/344 |

FOREIGN PATENT DOCUMENTS

| | | |
|---|---|---|
| 63-76479 | 4/1988 | Japan. |
| 1-205468 | 8/1989 | Japan. |
| 5-21785 | 1/1993 | Japan. |

OTHER PUBLICATIONS

Henry J. Geipel, Jr. et al., "Composite Silicide Gate Electrodes—Interconnections for VLSI Device Technologies," VLSI Metallisation: Phys. a Techn., 1991, pp. 172–179.

Lee et al., "Antireflective Coating for Submicron Lithography Processes," IEDMS of ROC, 1992, pp. 437–441.

"Recent Developments in Silicide Tecnique", Solid State Technology/Japanese Version/Nov. 1985.

*Primary Examiner*—Valencia Wallace
*Attorney, Agent, or Firm*—McDermott, Will & Emery

[57] ABSTRACT

In a semiconductor device having a polycide structure located on a stepped portion, halation during formation of a resist pattern is prevented, and oxidation of an upper surface of a high-melting-point metal silicide layer is prevented during formation of an interlayer insulating film on the polycide structure. In this semiconductor device, an upper layer which is formed of one layer selected from the group consisting of an amorphous silicon layer, a polycrystalline silicon layer, a TiN layer and a TiW layer is formed on the high-melting-point metal silicide layer forming the polycide structure. This effectively suppresses reflection of light beams by the upper layer located at the stepped portion during exposure for forming the resist pattern on the upper layer. Thereby, formation of a notch at the resist pattern is prevented, and the resist pattern is accurately formed to have a designed pattern. The upper layer made of the amorphous silicon layer or polycrystalline silicon layer prevents formation of an oxide layer at an upper surface of the high-melting-point metal silicide layer due to oxydation by Oxygen carried to the inside of the CVD furnace from the outside during formation of an interlayer insulating film covering the polycide structure.

7 Claims, 21 Drawing Sheets

SEMICONDUCTOR DEVICE HAVING A POLYCIDE STRUCTURE

This application is a continuation of application Ser. No. 08/563,421 filed Nov. 28, 1995, now abandoned.

BACKGROUND OF THE INVENTION

1. Field of the Invention

The present invention relates to a semiconductor device and a method of manufacturing the same, and in particular to a semiconductor device having a polycide structure formed of a polycrystalline silicon layer and a metal silicide layer having a high melting point and formed thereon as well as a method of manufacturing the same.

2. Description of the Background Art

A polycide structure which is formed of a polycrystalline silicon layer and a high-melting-point metal silicide layer formed on the polycrystalline silicon layer has been known as a structure used as an interconnection and a gate electrode layer in a VLSI. FIGS. 19 to 23 are cross sections and plans showing a process of manufacturing a gate electrode layer having a polycide structure in the prior art. FIG. 20 is a cross section taken along line 100—100 in FIG. 22, and FIG. 21 is a cross section taken along line 200—200 in FIG. 23. Referring first to FIGS. 19 to 23, a process of forming the gate electrode layer having the polycide structure in the prior art will now be described below.

As shown in FIG. 19, a field oxide film 3 for element isolation is formed at a predetermined region on a p-type silicon substrate 1 by a selective oxidation method, i.e., LOCOS (Local Oxidation of Silicon) method. Thereby, an active region 2 surrounded by field oxide film 3 is formed on a main surface of p-type silicon substrate 1. At this step, a bird's beak 3a is formed at a side edge or end of field oxide film 3. Bird's beak 3a forms a portion stepped with respect to active region 2 at the main surface of p-type silicon substrate 1.

Then, as shown in FIG. 20, thermal oxidation is effected on the surface of active region 2 to form a gate oxide film 5. A polycrystalline silicon layer 6 is formed by a low-pressure CVD (Chemical Vapor Deposition) method. A high-melting-point metal silicide layer (e.g., $WSi_2$ layer) 7 which is a compound of high-melting-point metal and silicon is formed on polycrystalline silicon layer 6 by a sputtering method. A resist pattern 9 is formed at a predetermined region on $WSi_2$ layer 7 by photolithography. Using resist pattern 9 as a mask, $WSi_2$ layer 7 and polycrystalline silicon layer 6 are anisotropically etched to pattern $WSi_2$ layer 7 and polycrystalline silicon layer 6. In this manner, the gate electrode layer formed of a polycide structure having an intended configuration is formed as shown in FIG. 21.

The manufacturing process has been described in connection with the section in the channel width direction of the gate electrode layer. Meanwhile, the manufacturing process related to the section in the channel length direction is as follows. FIGS. 25 to 34 are cross sections and plans showing the manufacturing process related to the section in the channel length direction of the gate electrode layer having the conventional polycide structure. FIG. 25 shows a cross section taken along line 500—500 in FIG. 34.

Referring to FIGS. 25 to 34, description will now be given on the manufacturing process related to the section in the channel length direction of the gate electrode layer having the polycide structure. More specifically, description will be given on the process of forming an MOS FET structure of LDD (Lightly Doped Drain) type. In the MOS FET structure of LDD type, portions of source/drain regions near a channel region are formed of lightly dope regions, and portions remote from the channel region are formed of heavily doped regions.

First, as shown in FIG. 25, gate oxide film 5, polycrystalline silicon layer 6 and high-melting-point metal silicide layer (e.g., $WSi_2$ layer) 7 are successively formed on p-type silicon substrate 1. Resist pattern 9 is formed at a predetermined region on $WSi_2$ layer 7 by photolithography. Using resist pattern 9 as a mask, $WSi_2$ layer 7, polycrystalline silicon layer 6 and a portion of gate oxide film 5 are anisotropically etched to form a configuration shown in FIG. 26.

Portions 5a of gate oxide film 5 located at regions for forming source/drain regions must be left for the following reasons. If the portions 5a were shaved to expose the main surface of p-type silicon substrate 1 at the step of etching polycrystalline silicon layer 6, the surface of p-type silicon substrate 1 would be etched suddenly. This is due to the fact that the polycrystalline silicon layer 6 and p-type silicon substrate 1 are made of similar materials (i.e., poly- and mono-crystalline silicon) and hence etching species for etching polycrystalline silicon layer 6 tend to etch p-type silicon substrate 1. Therefore, portions 5a of gate oxide film 5 must be left in order to prevent sudden etching of the surface of p-type silicon substrate 1.

In the above state, impurity is ion-implanted into the surface of p-type silicon substrate 1 using $WSi_2$ layer 7 and polycrystalline silicon layer 6 as a mask, whereby lightly doped n⁻-type impurity region 30 is formed.

Then, as shown in FIG. 27, an oxide film 13 is formed on the whole surface by the low-pressure CVD method. More specifically, the low pressure. CVD method is executed at a temperature in a middle range from 500° C. to 800° C. to decompose tetraethyl orthosilicate ($Si(OC_2H_5)_4$) for forming an oxide film 13. In general, the oxide film 13 formed by decomposing tetraethyl orthosilicate is called a TEOS oxide film. In the oxide film 13 formed by the CVD method, a portion located on the upper surface of $WSi_2$ layer 7 has the substantially same film thickness as a portion located on n-type impurity region 30.

Anisotropic etching is effected on the whole surface of oxide film 13 to form side wall oxide films 13a having a configuration shown in FIG. 28. The anisotropic etching for forming side wall oxide film 13a is continued until the surface of p-type silicon substrate 1 is exposed as shown in FIG. 30. Thus, the anisotropic etching is continued until gate oxide films 5a and oxide films 130a shown in FIGS. 28, 29 and 31 are completely removed. As shown in FIG. 30, using side wall oxide films 13a as a mask, n-type impurity is ion-implanted into p-type silicon substrate 1 to form heavily doped n⁺-type impurity regions 31. n⁻-type and n⁺-type impurity regions 30 and 31 form source/drain regions of the LDD structure.

Then, as shown in FIG. 32, an interlayer insulating film 15 is formed by the low pressure CVD method. FIG. 33 shows a structure in which interlayer insulating film 15 is formed on the structure including residual gate oxide films 5a shown in FIG. 31.

FIGS. 35 to 38 are cross sections and plans showing a process of manufacturing an interconnection formed of a conventional polycide structure. FIG. 35 is a cross section taken along line 300—300 in FIG. 37, and FIG. 36 is a cross section taken along line 400—400 in FIG. 38.

Referring to FIGS. 35 and 37, an interlayer insulating film 17 is formed on silicon substrate 1 by the low pressure CVD method or thermal oxidation. Interlayer insulating film 17 may be a thermally oxidized film of a small thickness. A lower layer interconnection 18 is formed at a predetermined region on interlayer insulating film 17. An interlayer insulating film 19 covering lower layer interconnection 18 is formed by the low pressure CVD method. At this step, a stepped portion 19a is formed. A polycrystalline silicon layer 20 and a WSi$_2$ layer (high-melting-point silicide layer) 21 are formed on interlayer insulating film 19 by the low pressure CVD method. A resist pattern 23 is formed at a predetermined region on WSi$_2$ layer 21 by photolithography. Using resist pattern 23 as a mask, anisotropic etching is effected on WSi$_2$ layer 21 and polycrystalline silicon layer 20, whereby patterned WSi$_2$ layer 21 and patterned polycrystalline silicon layer 20 are formed as shown in FIGS. 36 and 38. In this manner, the interconnection layer having the polycide structure is completed.

The following problems arise in the gate electrode layer and interconnection layer having the polycide structure.

In the gate electrode layer formed of the polycide structure shown in FIGS. 20 and 21, polycrystalline silicon layer 6 and WSi$_2$ layer 7 are formed over and lifted by the stepped portion which is formed at edge 4 of field oxide film 3 and is defined by bird's beak 3a of field oxide film 3. Therefore, during exposure for forming resist pattern 9, light beams are reflected by WSi$_2$ layer 7 located on the stepped portion, and the resist is unpreferably exposed to the reflected beams. As a result, a notch 9a unpreferably occurs at resist pattern 9 as shown in FIG. 22. This phenomenon is called halation.

The halation will be described below with reference to FIG. 24. FIG. 24 is a cross section taken along line 700—700 in the plan of FIG. 22. Referring to FIG. 24, exposure of a resist is ordinarily performed with a mask having a shade film 51 which is formed on a mask substrate 50. An exposed portion of the resist is removed by development, and only an unexposed portion remains as resist pattern 9. When light beams (i-rays) are applied toward a rear side of the mask, the light beams pass through a portion except for shade film 51. In general, therefore, a portion of the resist corresponding to shade film 51 is not exposed. However, if WSi$_2$ layer 7 located at the stepped portion reflects the light beams as shown in FIG. 24, the resist is exposed laterally to reflected beams. Consequently, the portion of resist corresponding to shade film 51 is partially exposed.

When development is performed thereafter, notch 9a occurs at resist pattern 9 as shown in FIGS. 22, 23 and 24. Thus, the portion which was exposed to light beams reflected by the stepped portion of WSi$_2$ layer 7 forms notch 9a after the development. If anisotropic etching is effected on WSi$_2$ layer 7 and polycrystalline silicon layer 6 with a mask formed of resist pattern 9 having notch 9a shown in FIG. 22, etched WSi$_2$ layer 7 has a pattern configuration provided with a notch 7a as shown in FIG. 23. Thus, if the resist pattern is formed on the polycide structure formed on and lifted by the stepped portion, intended resist pattern 9b cannot be formed but resist pattern 9 having notch 9a will be formed, so that the polycide structure accurately having a designed pattern cannot be formed.

This problem arises also in connection with the interconnection having the polycide structure formed on the stepped portion shown in FIGS. 35 to 38. If resist pattern 23 is formed on the stepped portion as shown in FIGS. 35 and 37, resist pattern 23 will have a notch 23a formed due to light beams reflected by WSi$_2$ layer 21 located at the stepped portion during exposure of resist pattern 23. Thus, intended pattern configuration 23b cannot be obtained, and notch 23a is formed in resist pattern 23.

Consequently, if resist pattern 23 having notch 23a is used as a mask and anisotropic etching is effected on underlying WSi$_2$ layer 21 and polycrystalline silicon layer 20, WSi$_2$ layer 7 will have a pattern configuration provided with notch 21a as shown in FIG. 38. A notch (not shown) will be formed also at the underlaying polycrystalline silicon layer. Therefore, WSi$_2$ layer 21 cannot have intended pattern configuration 21b, and will have a pattern configuration provided with notch 21a.

The following problem arises in the process of manufacturing the gate electrode layer having the conventional polycide structure, of which section in the channel length direction is shown in FIGS. 25 to 34. At the step of forming oxide film 13 shown in FIG. 27 by the CVD method, the structure is subjected to a temperature from 500° to 800° C., so that WSi$_2$ layer 7 crystallizes. Therefore, WSi$_2$ layer 7 tends to react with oxygen atoms to a higher extent, and thus is liable to be oxidized easily. If side wall oxide film 13a is formed subsequent to the above state as shown in FIG. 30, the upper surface of WSi$_2$ layer 7 is exposed. Thereafter, while interlayer oxide film 15 is being formed by the low pressure CVD method shown in FIG. 32, an oxide layer 16 made of WO$_3$ is formed at the surface of WSi$_2$ layer 7 due to oxidation by Oxygen carried from the outside of a CVD furnace to the inside of the CVD furnace during processing in the CVD furnace. Due to formation of oxide layer 16, a sheet resistance value of WSi$_2$ layer 7 unpreferably changes.

As described above, according to the conventional gate electrode layer or interconnection layer formed of the polycide structure, such problems arise that an intended pattern configuration cannot be obtained due to the halation during formation of the resist pattern, and that undesirable oxide layer 16 is formed on WSi$_2$ layer 7 during formation of the interlayer insulating film covering the polycide structure. Therefore, the sheet resistance value of the polycide structure unpreferably changes.

SUMMARY OF THE INVENTION

An object of the invention is to provide a semiconductor device having a polycide structure which is formed on a stepped portion, and in particular has an accurate pattern configuration.

Another object of the invention is to provide a semiconductor device having a polycide structure, and in particular having a structure which can prevent oxidation of an upper surface of a high-melting-point metal silicide layer.

Still another object of the invention is to provide a method of manufacturing a semiconductor device having a polycide structure formed on a stepped portion, and in particular a manufacturing method which can suppress halation during formation of a resist pattern.

Yet another object of the invention is to provide a method of manufacturing a semiconductor device having a polycide structure, and in particular a manufacturing method which can effectively prevent oxidation of s surface of a high-melting-point metal silicide layer.

A semiconductor device according to an aspect of the invention includes a stepped portion formed on a semiconductor substrate, a first polycrystalline silicon layer, a high-melting-point metal silicide layer, and an upper layer. The first polycrystalline silicon layer has a portion located on and lifted by the stepped portion. The high-melting-point metal silicide layer is formed on the first polycrystalline silicon layer. The upper layer is formed on the high-melting-point metal silicide layer, and is formed of one layer selected from the group consisting of an amorphous silicon layer, a polycrystalline silicon layer, a TiN layer and a TiW layer.

According to the semiconductor device of the above aspect, a quantity of light beams reflected by the upper layer can be small during exposure for forming a resist pattern. More specifically, assuming that a reflectivity of aluminum with respect to i-rays is 100, all the amorphous silicon layer, polycrystalline silicon layer, TiN layer and TiW layer are made of materials having a reflectivity not larger than 50, so that reflection of light beams during exposure of the resist pattern is suppressed. Thereby, in spite of the fact that the semiconductor device has the polycide structure formed on and lifted by the stepped portion, it is possible to prevent generation of a notch in a resist pattern which may be caused by exposure to reflected light beams. As a result, an underlying polycide structure which is patterned using the above resist pattern as a mask can be patterned to have a configuration not including a notch. Consequently, the designed pattern configuration can be accurately formed. If the amorphous silicon layer or polycrystalline silicon layer is used as the upper layer, it is possible to prevent effectively oxidation of the upper surface of the high-melting-point metal silicide layer during formation of an interlayer insulating film covering the polycide structure. In this case, only the upper surface of the upper layer made of the silicon layer is oxidized, and the high-melting-point metal silicide layer is not oxidized, so that it is possible to prevent change of a sheet resistance value of the high-melting-point metal silicide layer.

A semiconductor device according to another aspect of the invention includes a semiconductor substrate, a pair of source/drain regions, a first polycrystalline silicon layer, a high-melting-point metal silicide layer, an upper layer, a side wall insulating film and a concavity. The semiconductor substrate has a main surface. The pair of source/drain regions are formed on the main surface of the semiconductor substrate and are spaced by a predetermined distance from each other to define a channel region therebetween. The first polycrystalline silicon layer is formed on the channel region with a gate insulating layer therebetween. The high-melting-point metal silicide layer is formed on the first polycrystalline silicon layer. The upper layer is formed on the high-melting-point metal silicide layer, and is formed of one layer selected from the group consisting of an amorphous silicon layer, a polycrystalline silicon layer, a TiN layer and a TiW layer. A side wall insulating film is formed in contact with at least side surfaces of the first polycrystalline silicon layer and the high-melting-point metal silicide layer. The concavity is formed at the main surface of the semiconductor substrate located outside an end of a lower surface of the side wall insulating film.

According to the semiconductor device of the above aspect, a gate electrode structure including a polycide structure is provided with the upper layer, which is located on the high-melting-point metal silicide layer and is formed of one layer selected from the group consisting of the amorphous silicon layer, polycrystalline silicon layer, TiN layer and TiW layer. Therefore, if the amorphous silicon layer or polycrystalline silicon layer is used as the upper layer, the upper layer prevents oxidation of the surface of the high-melting-point metal silicide layer by Oxygen carried from the outside of the CVD furnace to the inside of the CVD furnace during formation of an interlayer insulating film covering a gate electrode. Thereby, it is possible to prevent formation of an oxide layer at the surface of the high-melting-point metal silicide layer. If the above gate electrode structure is formed on the stepped portion, halation during formation of a resist pattern is effectively prevented owing to provision of the upper layer made of the amorphous silicon layer, polycrystalline silicon layer, TiN layer or TiW layer having a low reflectivity. Thereby, the resist pattern can be formed accurately in accordance with design. Consequently, the gate structure accurately having a designed pattern configuration can be formed easily. Since the concavity is formed at the main surface of the semiconductor substrate located outside the end of the lower surface of the side wall insulating film, overetching for forming the concavity removes an oxide film, which was formed on the surface of the substrate, from the whole surface of the substrate, so that the oxide film does not remain at any position on the whole substrate surface. Therefore, the substrate surfaces at the active regions beside the side walls are exposed in a whole wafer. Consequently, ion implanting conditions can be uniform as compared with the conventional cases where oxide films remain at some places and where the oxide film have portions of different thicknesses. Therefore, uniformity in the implanting process can be achieved, and thus source/drain regions having uniform characteristics can be formed.

According to a method of manufacturing a semiconductor device of still another aspect of the invention, a first polycrystalline silicon layer is formed to have a portion located on and lifted by a stepped portion formed on a semiconductor substrate. A high-melting-point metal silicide layer is formed on the first polycrystalline silicon layer. An upper layer formed of one layer selected from the group consisting of an amorphous silicon layer, a polycrystalline silicon layer, a TiN layer and a TiW layer is formed on the high-melting-point metal silicide layer. A resist is formed on the upper layer. Exposure and development are effected on the resist to form a resist pattern. Using the resist pattern as a mask, the upper layer, the silicide layer and the first polycrystalline silicon layer are etched to pattern the same.

According to the method of the above aspect, reflection of light beams at the stepped portion can be suppressed owing to the upper layer having a low reflectivity during exposure for forming the resist pattern. Thereby, the halation is prevented, and the resist pattern accurately having a designed pattern configuration can be formed easily. As a result, the polycide structure accurately having the designed pattern configuration can be formed.

According to a method of manufacturing a semiconductor device of yet another aspect of the invention, a polycrystalline silicon layer is formed at a predetermined region on a main surface of a semiconductor substrate with a gate insulating film therebetween. A high-melting-point metal silicide layer is formed on the polycrystalline silicon layer. A silicon layer is formed on the high-melting-point metal silicide layer. The silicon layer, the high-melting-point metal silicide layer and the polycrystalline silicon layer are patterned. After depositing an insulating film on the silicon layer, the high-melting-point metal silicide layer and the polycrystalline silicon layer thus patterned, anisotropic etching is effected to form a side wall insulating film in contact with at least side surfaces of the high-melting-point metal silicide layer and the polycrystalline silicon layer. A concavity is formed at the main surface of the semiconductor substrate by the anisotropic etching effected for forming the side wall insulating film. An insulating film covering the silicon layer and the side wall insulating film are formed.

According to the above method of manufacturing the semiconductor device provided with a polycide structure as a gate electrode structure, the silicon layer is formed on the high-melting-point metal silicide layer and then the insulating film covering them is formed, so that oxidation of the surface of the high-melting-point metal silicide layer is effectively prevented during formation of the insulating film. Thereby, change of a sheet resistance value of the high-melting-point metal silicide layer is prevented. Since the concavity is formed at the main surface of the semiconductor substrate by the anisotropic etching which is effected for forming the side wall insulating film on at least the side surfaces of the high-melting-point metal silicide layer and the polycrystalline silicon layer, the oxide film does not remain at any position on the whole surface of the semiconductor substrate, so that the substrate surfaces at the active regions beside the side wall insulating films are exposed in a whole wafer. Consequently, ion implanting conditions can be uniform as compared with the conventional cases where oxide films remain at some places and where the oxide film have portions of different thicknesses. Thereby, impurity regions are formed uniformly in the whole substrate. Therefore, a plurality of source/drain regions can have uniform characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings. Referring to FIGS. 1 to 5, a process of manufacturing a semiconductor device of a first embodiment and a structure thereof will be described below.

Figure 1:
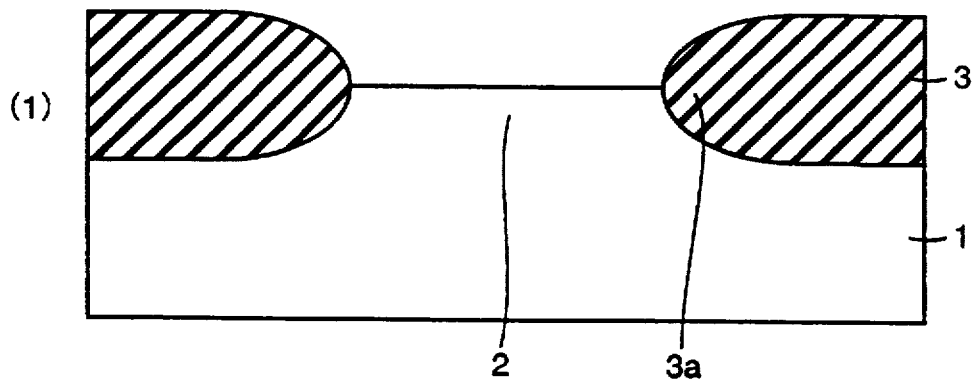
FIGS. 1 to 3 are cross sections showing 1st to 3rd steps in a process of manufacturing a semiconductor device of a first embodiment of the invention, respectively.
Figure 2:
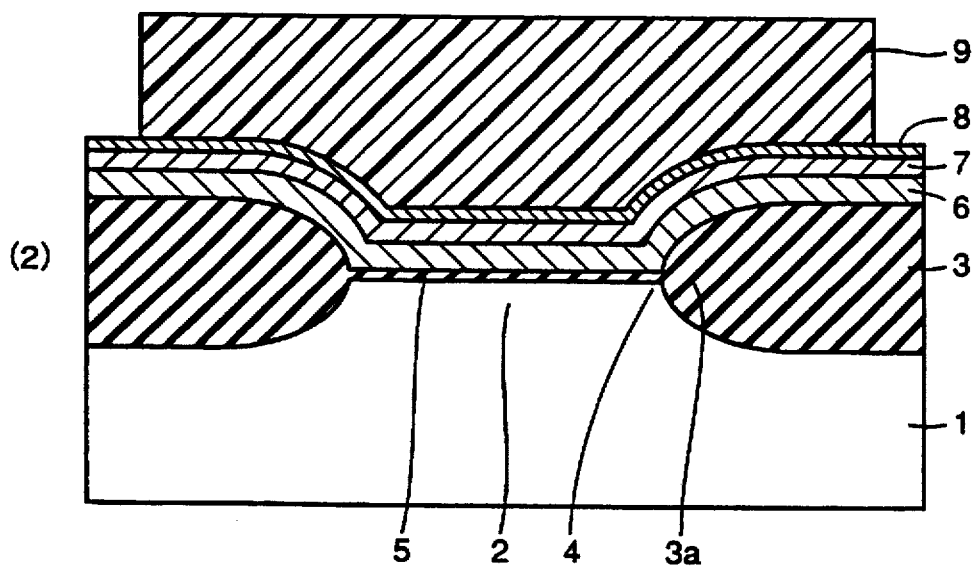

First, as shown in FIG. 1, a field oxide film 3 is formed at a predetermined region on a main surface of a p-type silicon substrate 1 by the LOCOS method. Thereby, an active region 2 for forming an element is formed. A so-called bird's beak 3a is formed at an end of field oxide film 3, and bird's beak 3a forms a stepped portion with respect to active region 2. Subsequent to this state, a gate oxide film 5 is formed at the main surface of p-type silicon substrate 1 located at active region 2 by thermal oxidation as shown in FIG. 2. A polycrystalline silicon layer 6 is formed on gate oxide film 5 and field oxide film 3 by the low pressure CVD method. A high-melting-point metal silicide layer ($WSi_2$ layer) 7, which has a thickness equal to or smaller than that of polycrystalline silicon layer 6, is formed on polycrystalline silicon layer 6, e.g., by the sputtering method. An amorphous silicon layer 8 is formed on $WSi_2$ layer 7 by the sputtering method.

Figure 4:
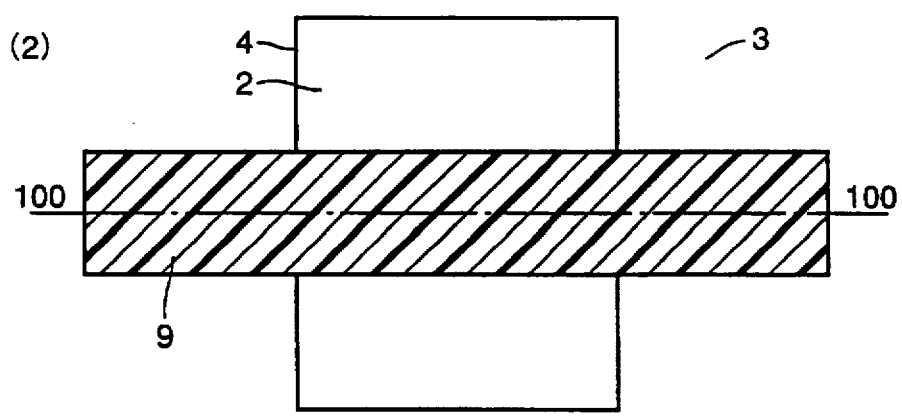
FIG. 4 is a plan of a structure shown in FIG. 2.

A resist pattern 9 is formed at a predetermined region on amorphous silicon layer 8 by photolithography. At this step, pattern configuration 9, which does not have a notch configuration in contrast to the prior art, can be formed as shown in FIG. 4. This is owing to the fact that amorphous silicon layer 8 located under resist pattern 9 has a reflectivity lower than that of $WSi_2$ layer, so that reflection of light beams by amorphous silicon layer 8 at the stepped portion are suppressed during exposure of resist. Thereby, the halation which may occur due to the light beams reflected by the lower layer during formation of resist pattern 9 can be prevented effectively. Consequently, formation of the notch configuration due to the halation can be prevented effectively. Therefore, it is possible to form resist pattern 9 accurately having the pattern configuration of design sizes.

Figure 3:
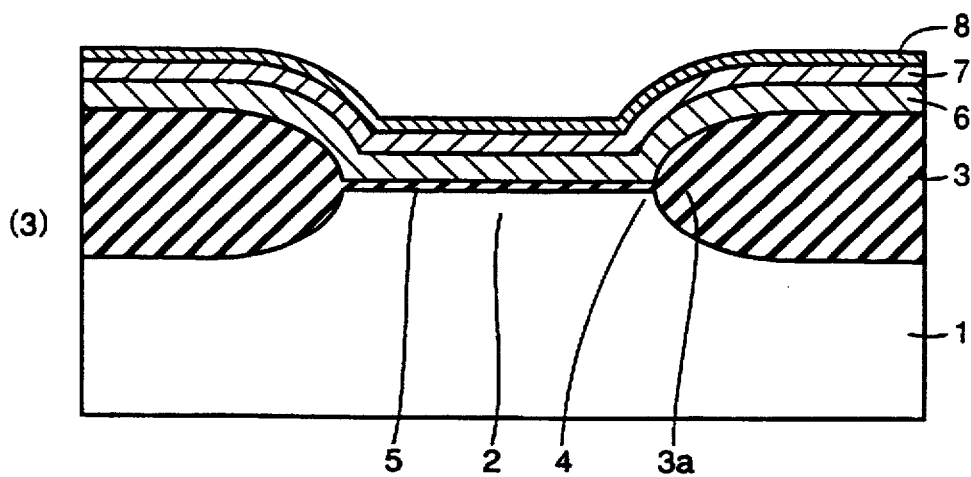
Figure 5:
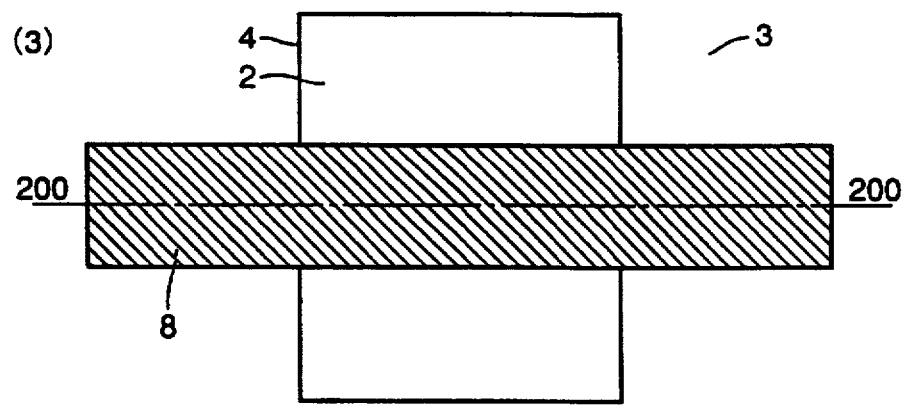
FIG. 5 is a plan of a structure shown in FIG. 3.

As a result, by anisotropically etching the lower layers, i.e., amorphous silicon layer 8, $WSi_2$ layer 7 and polycrystalline silicon layer 6 with resist pattern 9, amorphous silicon layers 8, $WSi_2$ layer 7 and polycrystalline silicon layer 6 can accurately have the designed pattern configurations as shown in FIGS. 3 and 5.

Now, description will be given on a difference between reflectivities of amorphous silicon layer 8 and $WSi_2$ layer 7. Assuming that aluminum has the reflectivity of 100 with respect to i-rays (365 nm) used for exposure of resist pattern 9, the reflectivity must not be larger than 50 in order to form resist pattern 9 without causing the halation. $WSi_2$ layer 7 which is an example of the high-melting-point metal silicide layer has the reflectivity of 44, and amorphous silicon layer 8 has the reflectivity of 44. Therefore, provision of amorphous silicon layer 8 can effectively prevent the halation. Instead of amorphous silicon layer 8, a polycrystalline silicon layer, TiN layer or TiW layer having a reflectivity not larger than 50 may be used to achieve a similar effect.

Polycrystalline silicon layer 6 contains n-type or p-type impurity, and amorphous silicon layer 8 contains impurity of the same conductivity type as polycrystalline silicon layer 6.

Figure 6:
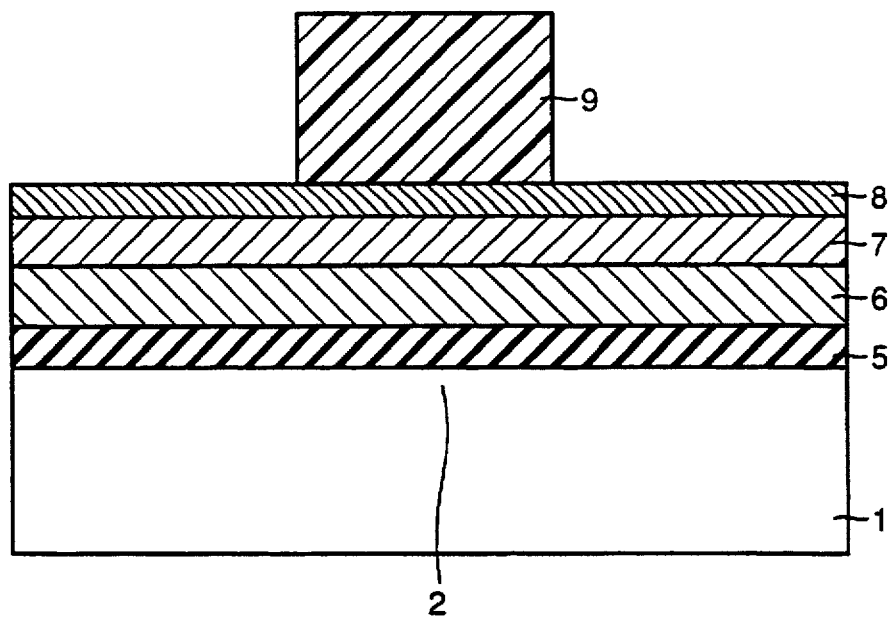
FIGS. 6 to 13 are cross sections showing 1st to 8th steps in a process of manufacturing a semiconductor device of a second embodiment of the invention.
Figure 34:
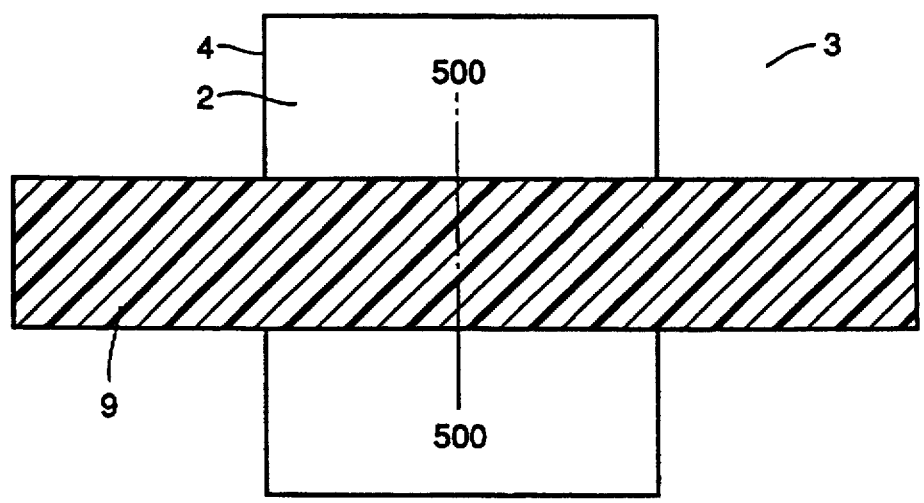
FIG. 34 is a plan of a structure shown in FIG. 25.
Figure 35:
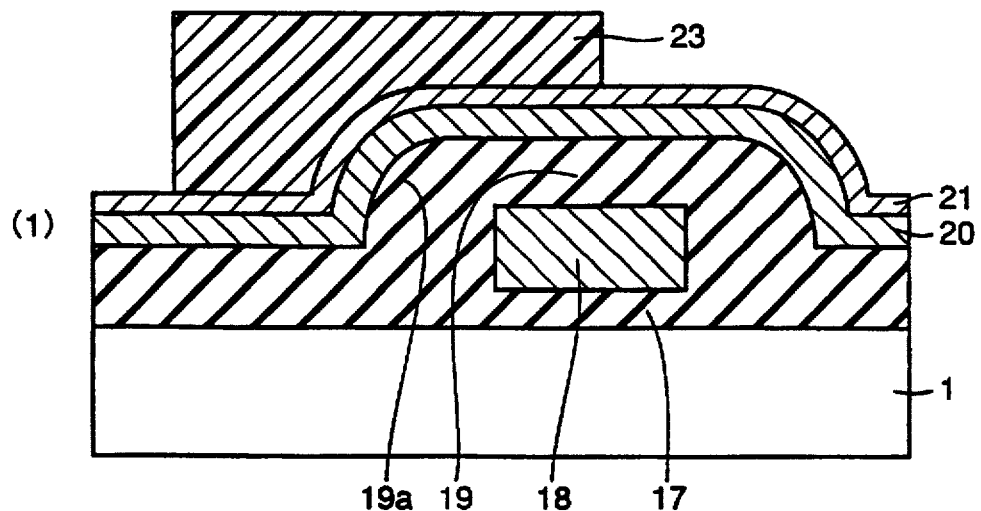
FIGS. 35 and 36 are cross sections showing 1st and 2nd steps in still another process of manufacturing a semiconductor device in the prior art.
Figure 36:
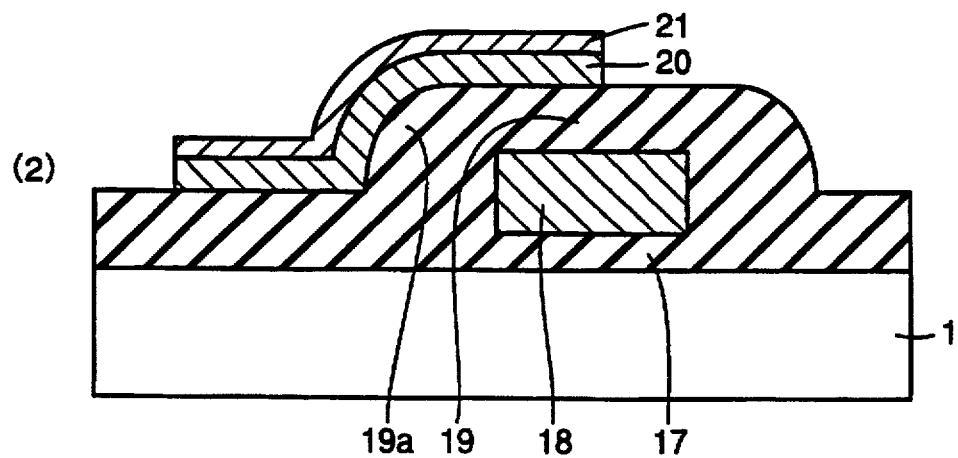
Figure 37:
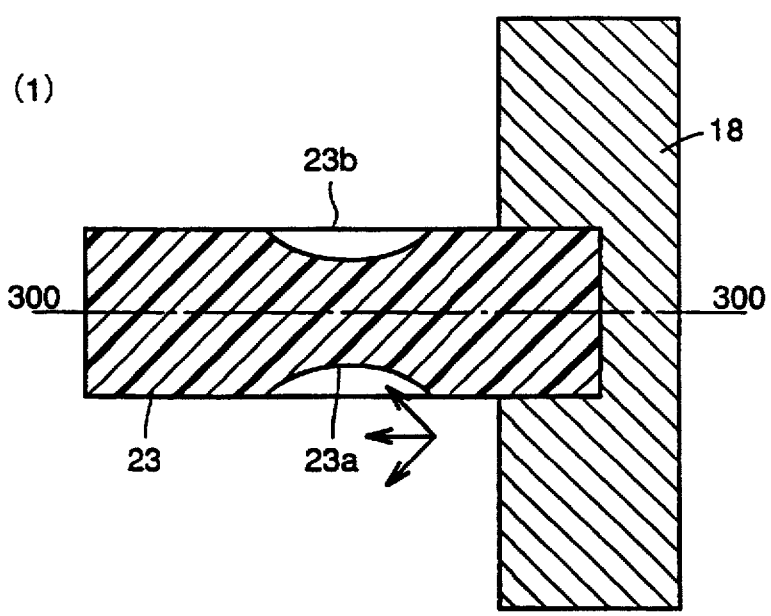
FIG. 37 is a plan of a structure shown in FIG. 35.
Figure 38:
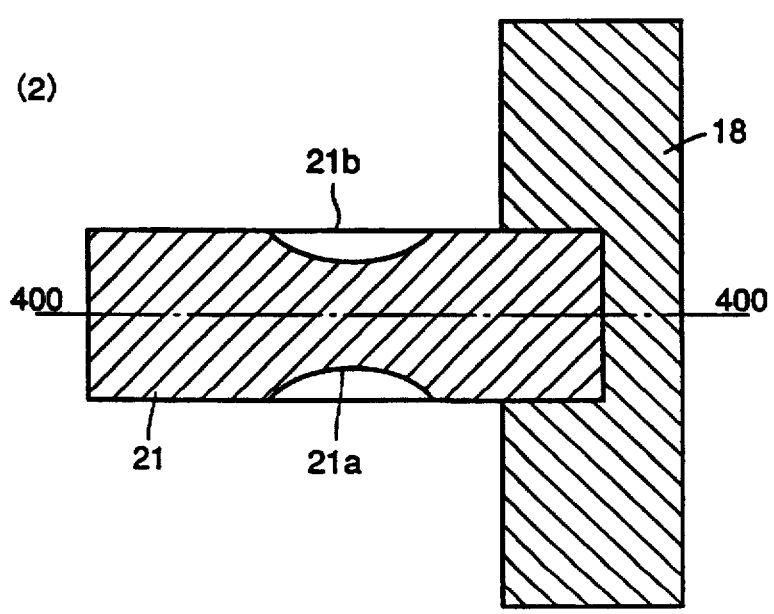
FIG. 38 is a plan of a structure shown in FIG. 36.

Referring to FIGS. 6 to 13, description will be given on a process of manufacturing a semiconductor device of a second embodiment and a structure thereof. FIG. 6 is a cross section corresponding to that taken along line 500—500 in the plan of FIG. 34 showing a prior art. After forming a field oxide film (not shown) at a predetermined region on the main surface of p-type silicon substrate 1 by the LOCOS method, polycrystalline silicon layer 6 is formed on active region 2 surrounded by the above field oxide film by the low pressure CVD method. The high-melting-point metal silicide layer (e.g., $WSi_2$ layer) 7 which is a compound of high-melting-point metal and silicon is formed on polycrystalline silicon layer 6, e.g., by the sputtering method. Thereby, the polycide structure formed of polycrystalline silicon layer 6 and WSi$_2$ layer 7 is formed. Amorphous silicon layer 8 is formed at the top of the polycide structure by the sputtering method. Resist pattern 9 is formed at the predetermined region on amorphous silicon layer 8 by photolithography.

Using resist pattern 9 as a mask, amorphous silicon layer 8, WSi$_2$ layer 7 and polycrystalline silicon layer 6 are anisotropically etched to pattern them. Depending on the selectivity with respect to gate oxide film 5 in this anisotropic etching, upper portions of gate oxide film 5a located at portions subjected to the anisotropic etching are etched to some extent. If gate oxide films 5a were shaved to expose the substrate surface by the anisotropic etching effected for polycrystalline silicon layer 6, the surface of substrate, which is made of silicon similar to a material of polycrystalline silicon layer 6, would be suddenly shaved. Therefore, gate oxide films 5a must be left. After this step, using amorphous silicon layer 8, WSi$_2$ layer 7 and polycrystalline silicon layer 6 as a mask, n-type impurity is ion-implanted into p-type silicon substrate 1, so that lightly doped n$^-$-type impurity regions 30 are formed.

Figure 8:
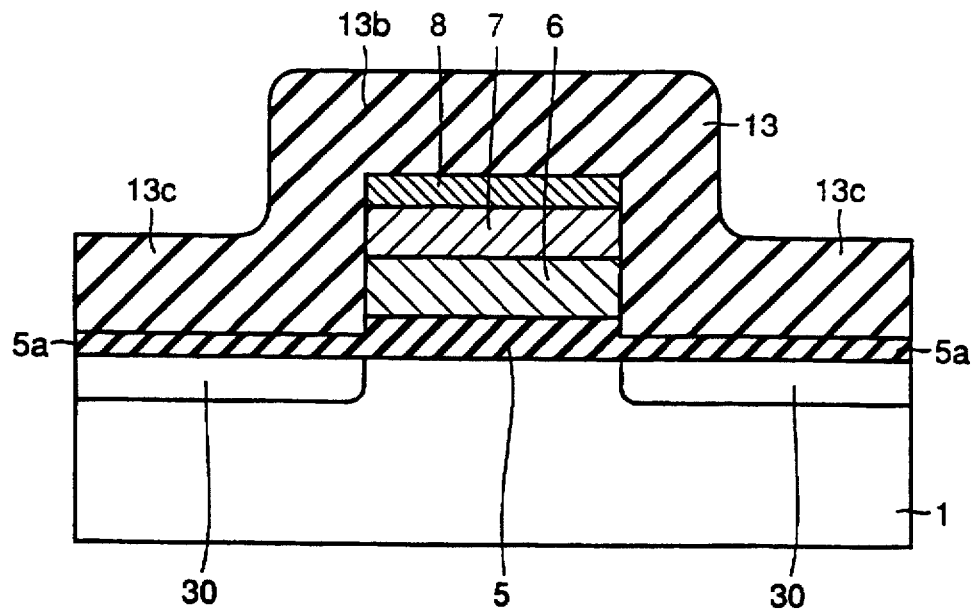

As shown in FIG. 8, an oxide film 13 is formed by the low pressure CVD method. In a specific process of manufacturing oxide film 13, it may be formed by decomposing tetraethyl orthosilicate (Si(OC$_2$H$_5$)$_4$) with a low pressure CVD device at a temperature in a middle range from 500° C. to 800° C. In general, the compound produced by this decomposition is called TEOS. Since the oxide film 13 is formed by the CVD method, a portion 13b located on amorphous silicon layer 8 has the substantially same film thickness as a portion 13c located on gate oxide film 5a.

Figure 9:
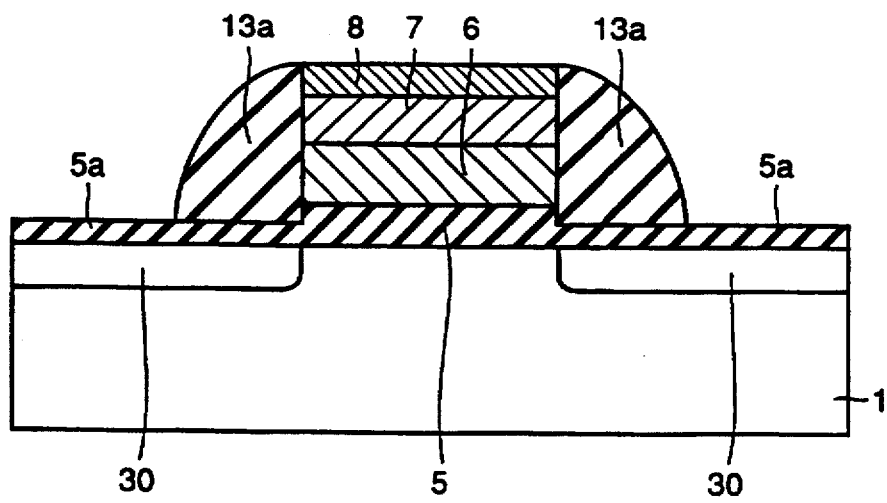

Due to the temperature from 500° to 800° C. during formation of oxide film 13, WSi$_2$ layer 7 crystallizes. Therefore, WSi$_2$ layer 7 tends to react with oxygen atoms to a higher extent, and thus is liable to be oxidized. However, amorphous silicon layer 8 is formed on WSi$_2$ layer 7, so that it is possible to prevent effectively the oxidation of the surface of WSi$_2$ layer 7 during formation of interlayer oxide film 15, which will be described later. Subsequent to the step shown in FIG. 8, anisotropic etching is effected on whole oxide film 13 to form side wall oxide films 13a as shown in FIG. 9. When side wall oxide films 13a are formed, a top surface of amorphous silicon layer 8 is exposed.

Figure 10:
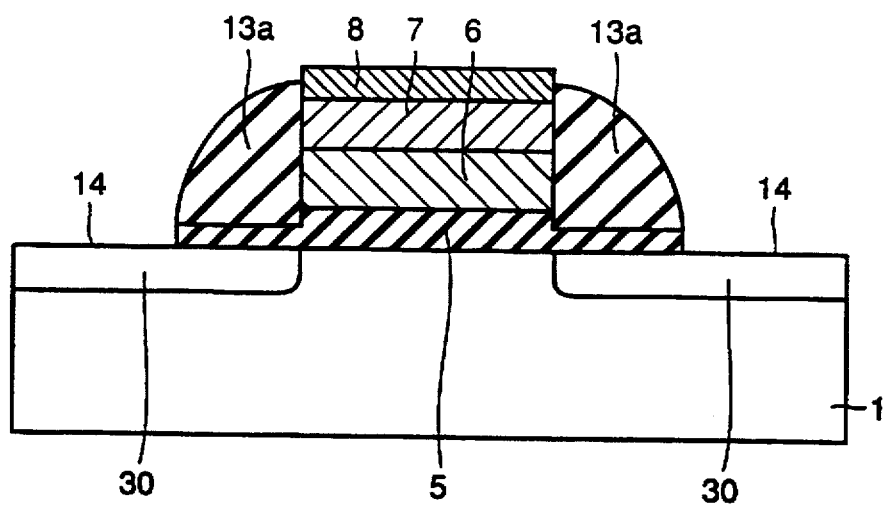
Figure 11:
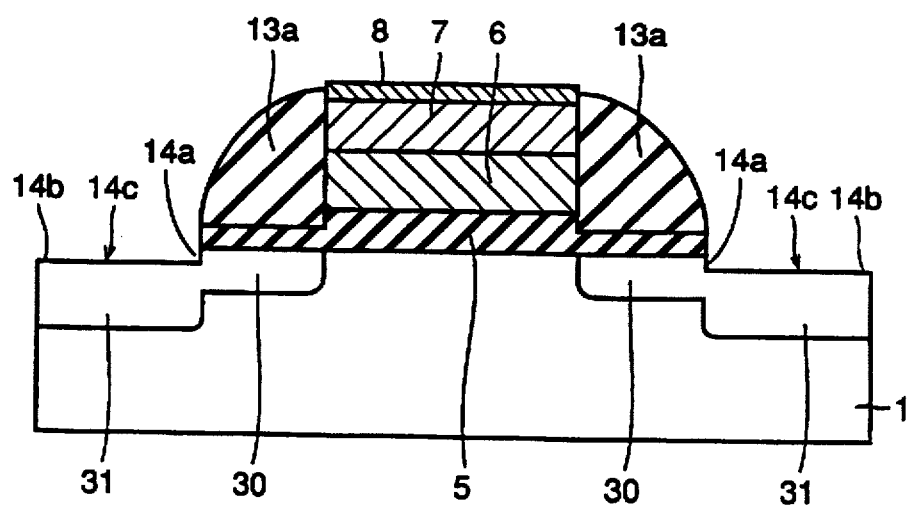
Figure 12:
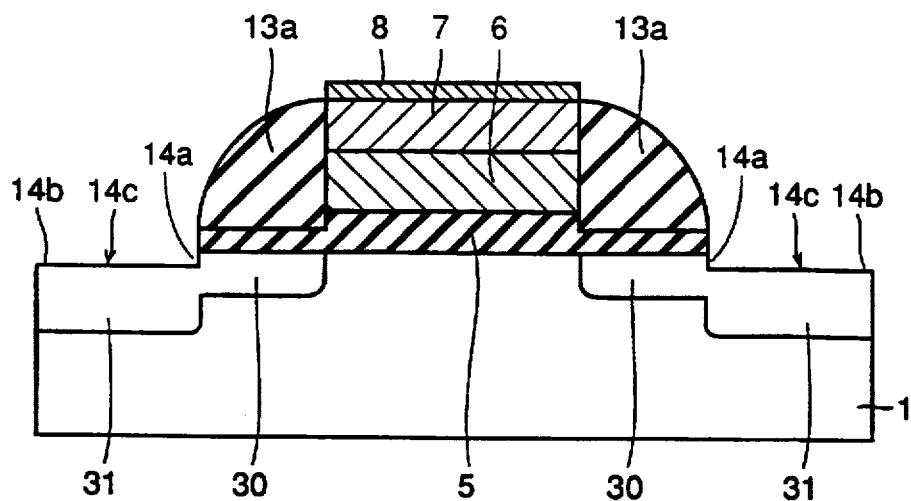

As shown in FIG. 10, overetching is effected to expose a surface 14 of p-type silicon substrate 1. This overetching also exposes a portion of each side surface of amorphous silicon layer 8. However, the etching is not effected to such an extent that the side surface of WSi$_2$ layer 7 is exposed. In order to expose a substrate surface 14 outside each side wall oxide film 13a in the semiconductor substrate, substrate surface 14 must be overetched to some extent. This overetching forms a concavity 14c at each substrate surface 14 as shown in FIG. 11. Concavity 14c is formed of a new substrate surface 14b and a vertical surface 14a. The overetching for forming concavity 14c is effected with etching species for the anisotropic etching of side wall oxide film 13a. The anisotropic etching for forming concavity 14c is effected to such an extent that the side surface of WSi$_2$ layer 7 is not exposed.

Using side wall oxide films 13a as a mask, n-type impurity is ion-implanted into concavities 14c to form heavily doped n$^+$-type impurity regions 31. At the step of this ion implantation, the substrate surfaces outside side wall oxide films 13a in the whole wafer are exposed as a result of the anisotropic etching for forming concavities 14c, so that conditions of ion-implantation can be uniform in the whole substrate surface as compared with the cases where gate oxide films 5a remain at some positions and where gate oxide film 5a has portions of different thicknesses. Therefore, n$^+$-type impurity regions 31 thus formed can be uniform in the whole substrate. Consequently, a plurality of n$^+$-type impurity regions 31 having uniform characteristics can be formed throughout the substrate.

Figure 13:
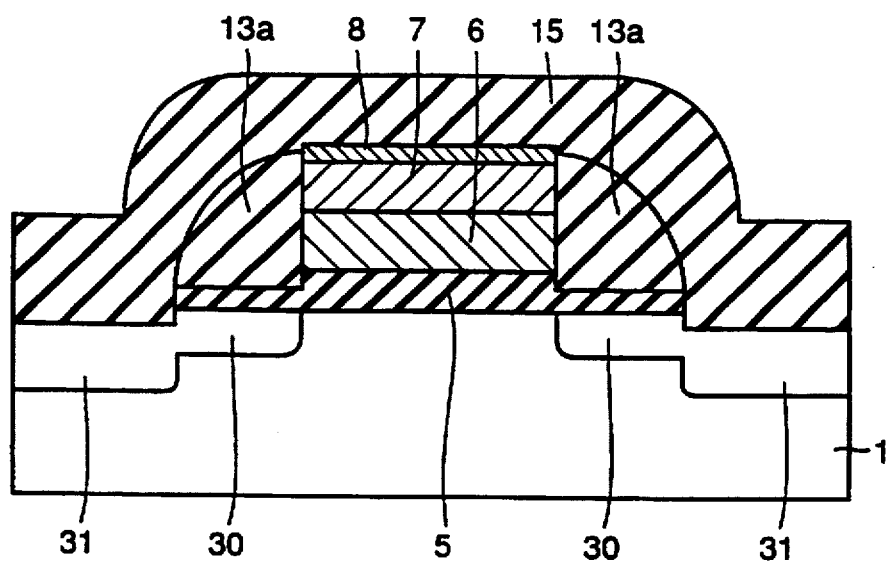

Thereafter, as shown in FIG. 13, interlayer insulating film 15 is formed by the low pressure CVD method. Interlayer insulating film 15 is provided for isolating amorphous silicon layer 8 from an interconnection layer (not shown) to be formed thereon. At the step of forming interlayer insulating film 15, even if entrained oxygen exists during processing in a CVD furnace, oxidation of WSi$_2$ layer 7 does not occur because the side and top surfaces of WSi$_2$ layer 7 are not exposed. Therefore, it is possible to prevent formation of an oxide layer at the top surface of WSi$_2$ layer 7. Consequently, it is possible to prevent change of a sheet resistance value of WSi$_2$ layer 7. Polycrystalline silicon layer 6 contains n-type or p-type impurity, and amorphous silicon layer 8 contains impurity of the same conductivity type as polycrystalline silicon layer 6.

Figure 7:
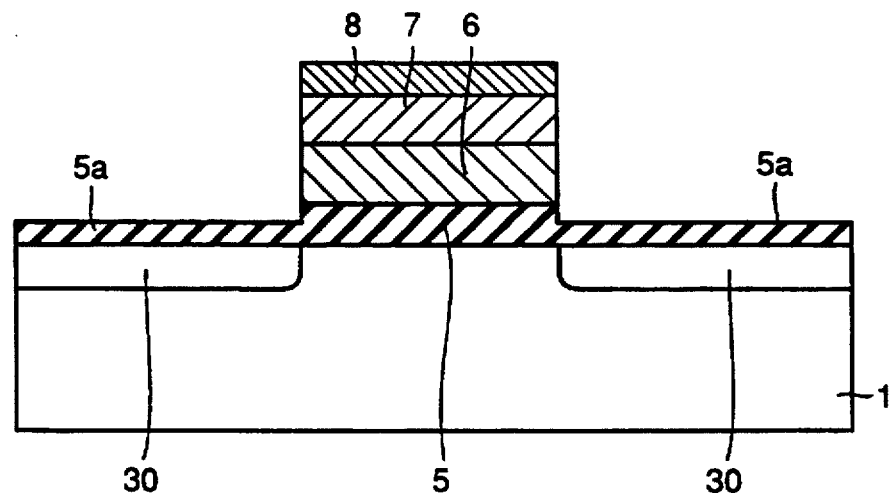

As already stated, it is necessary to leave gate oxide film 5a at the step of anisotropically etching polycrystalline silicon layer 6 shown in FIG. 7. In general, this anisotropic etching is performed, e.g., with a chlorine-contained gas. The etching of WSi$_2$ layer 7 progresses at a rate higher by about 20–30% than that of polycrystalline silicon layer 6. Thus, gate oxide film 5a does not remain stably if polycrystalline silicon layer 6 is extremely thin. In order to leave gate oxide film 5a stably, polycrystalline silicon layer 6 must have a thickness equal to or larger than that of WSi$_2$ layer 7.

Amorphous silicon layer 8 may be a polycrystalline silicon layer, a TiN layer or a TiW layer.

Figure 14:
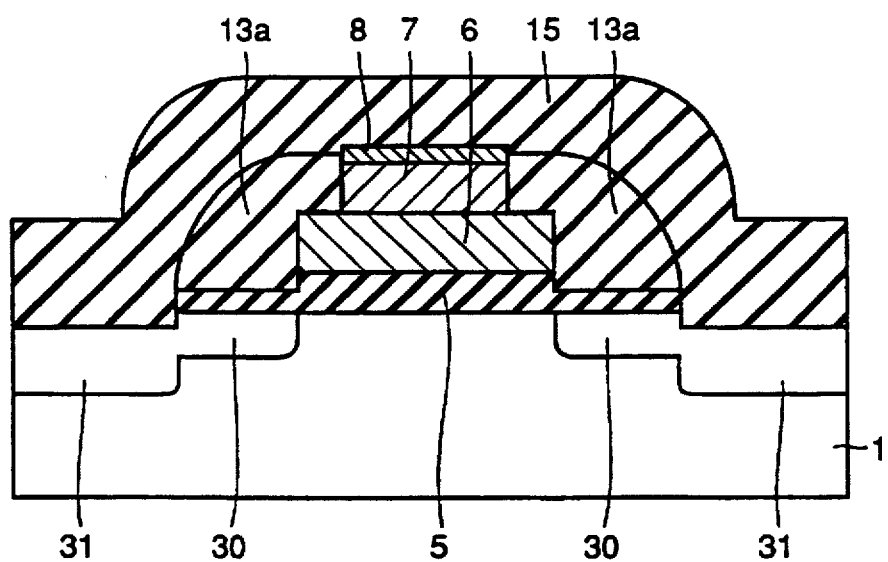
FIG. 14 is a cross section showing a structure which is formed when etching conditions vary in the process of manufacturing the semiconductor device of the second embodiment shown in FIG. 7.

Although amorphous silicon layer 8, WSi$_2$ layer 7 and polycrystalline silicon layer 6 are anisotropically etched as shown in FIG. 7, they may be etched to have a configuration shown in FIG. 14 depending on etching conditions.

Referring to FIGS. 15 to 18, description will be given on a method of manufacturing a semiconductor device and a structure thereof of a third embodiment.

Figure 15:
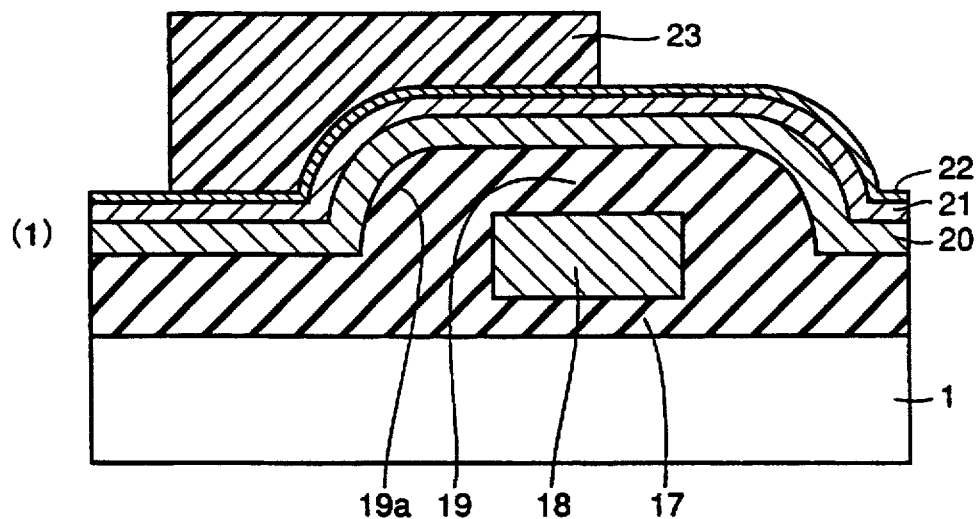
FIGS. 15 and 16 are cross sections showing 1st and 2nd steps in a process of manufacturing a semiconductor device of a third embodiment of the invention, respectively.
Figure 16:
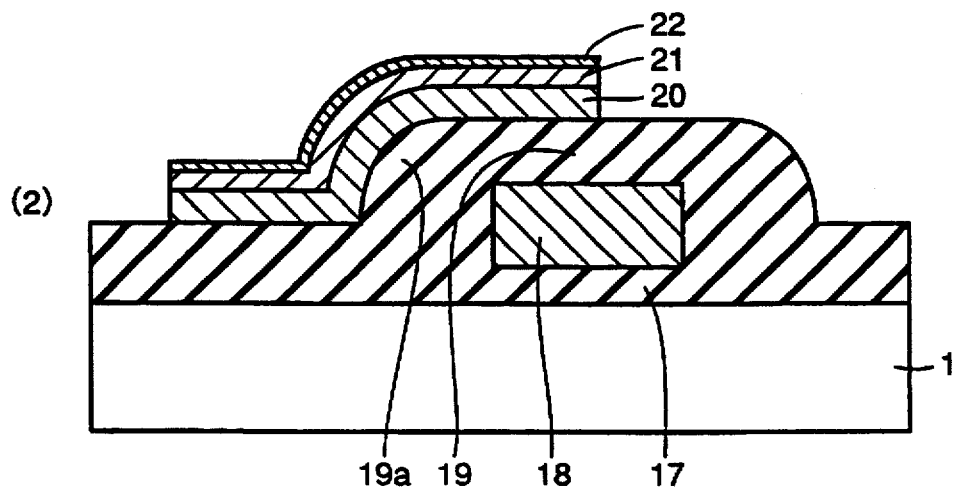
Figure 17:
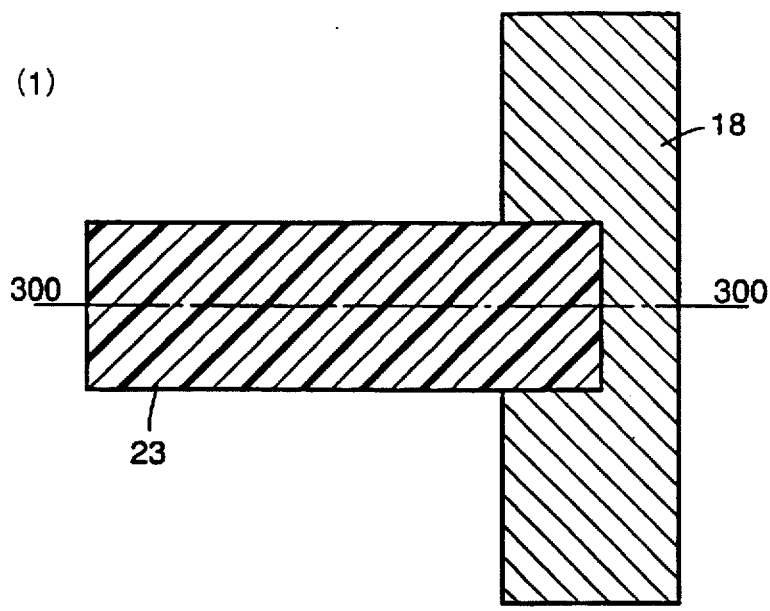
FIG. 17 is a plan of a structure shown in FIG. 15.

As shown in FIGS. 15 to 17, an interlayer insulating film 17 is formed on p-type silicon substrate 1 by the low pressure CVD method or thermal oxidation method. Interlayer insulating film 17 may be a thermally oxidized thin film. A lower layer interconnection 18 is formed at a predetermined region on interlayer insulating film 17. An interlayer insulating film 19 covering lower layer interconnection layer 19 is formed by the low pressure CVD method. At this time, a stepped portion 19a is formed at interlayer insulating film 19. A polycrystalline silicon layer 20 is formed on the upper surface of interlayer insulating film 19 including stepped portion 19a by the low pressure CVD method.

A high-melting-point metal silicide layer (e.g., WSi$_2$ layer) 21 is formed on polycrystalline silicon layer 20, e.g., by the sputtering method. Thereby, a polycide structure formed of polycrystalline silicon layer 20 and high-melting-point metal silicide layer (WSi$_2$ layer) 21 is formed. An amorphous silicon layer 22 is formed on WSi$_2$ layer 21 by the sputtering method. A resist pattern 23 is formed at a predetermined region on amorphous silicon layer 22 by the photolithography. During exposure for forming resist pattern 23, resist pattern 23 does not have a notch configuration in contrast to the prior art. This is owing to the fact that amorphous silicon layer 22 under resist pattern 23 has a low reflectivity. Therefore, it is possible to suppress effectively reflection of light beams by a portion of amorphous silicon layer 22 located at stepped portion 19a during exposure of resist pattern 23. Thereby, a conventional halation can be prevented. Consequently, resist pattern 23 not having a notch configuration can be formed easily as shown in FIG. 17.

Figure 18:
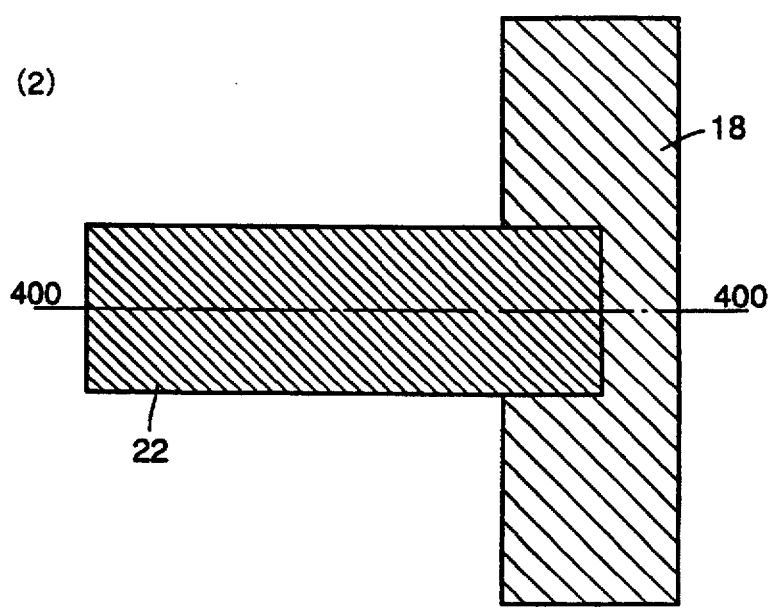
FIG. 18 is a plan of a structure shown in FIG. 16.
Figure 19:
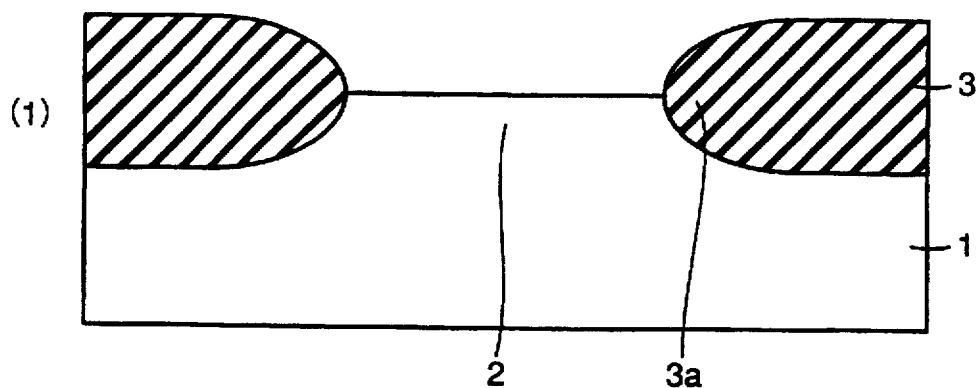
FIGS. 19 to 21 are cross sections showing 1st to 3rd steps in a process of manufacturing a semiconductor device in the prior art, respectively.
Figure 20:
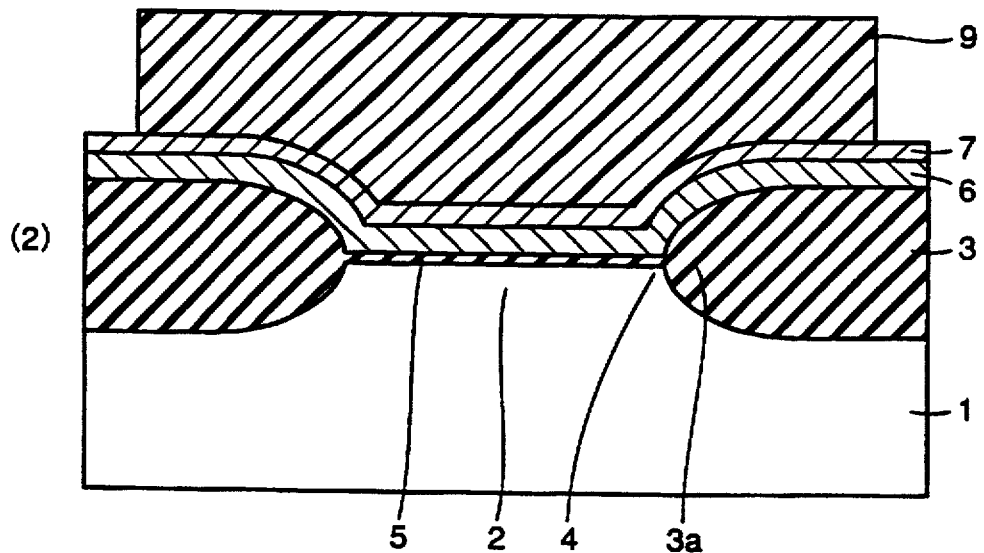
Figure 21:
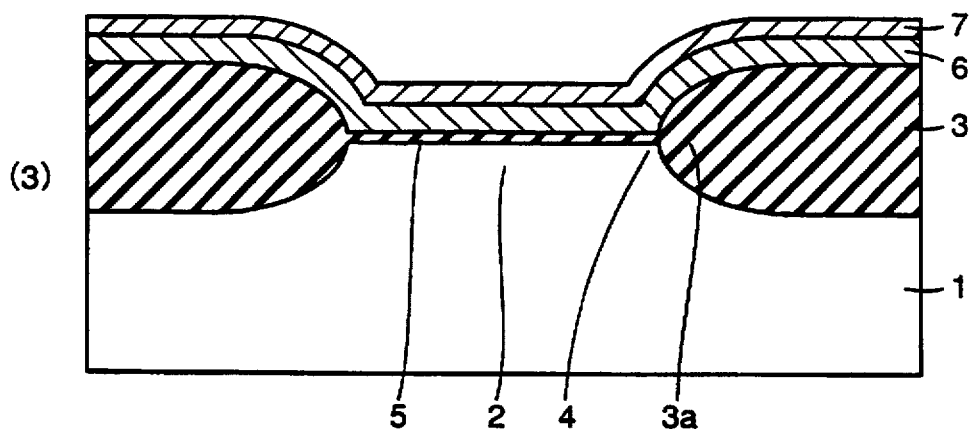
Figure 22:
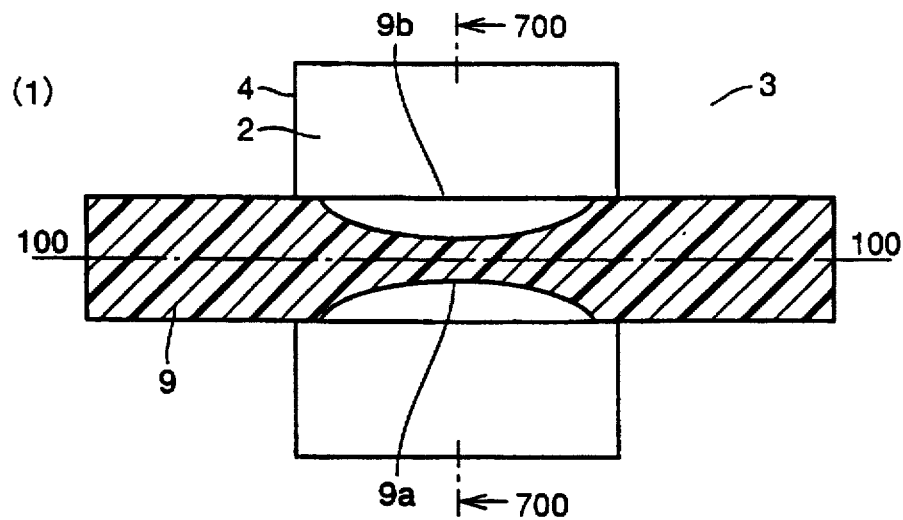
FIG. 22 is a plan of a structure shown in FIG. 20.
Figure 23:
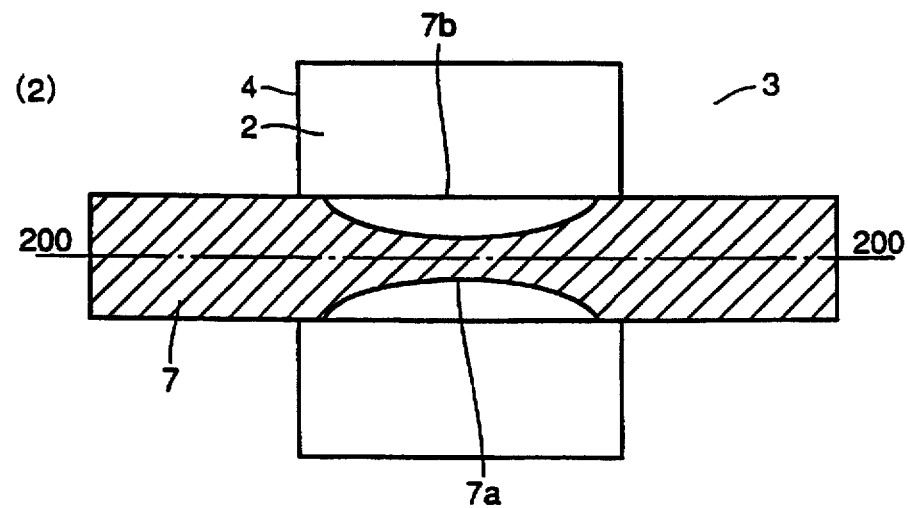
FIG. 23 is a plan of a structure shown in FIG. 21.
Figure 24:
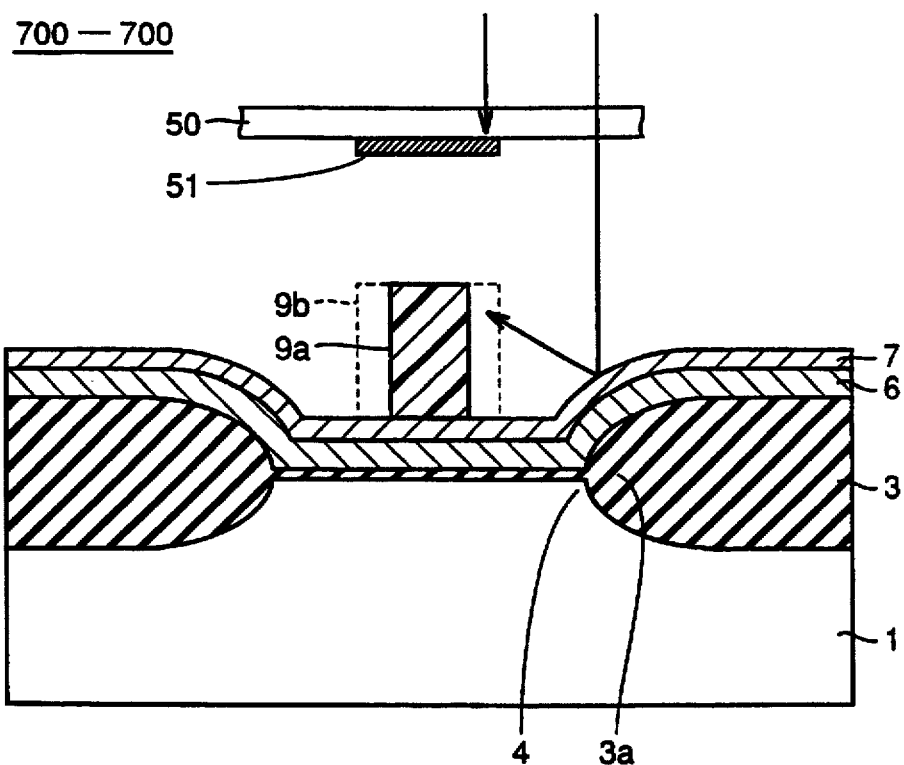
FIG. 24 is a cross section showing a problem in a process of manufacturing a semiconductor device in the prior art.
Figure 25:
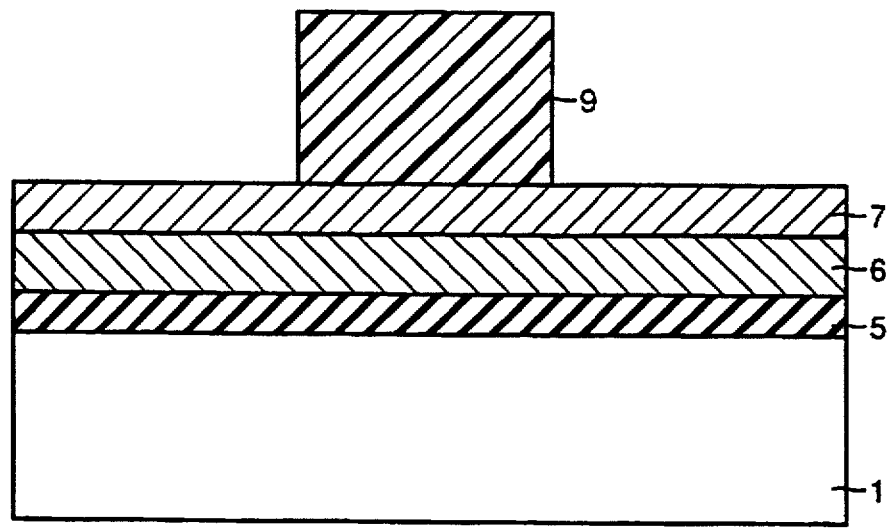
FIGS. 25 to 33 are cross sections showing processes of manufacturing a semiconductor device in the prior art.
Figure 26:
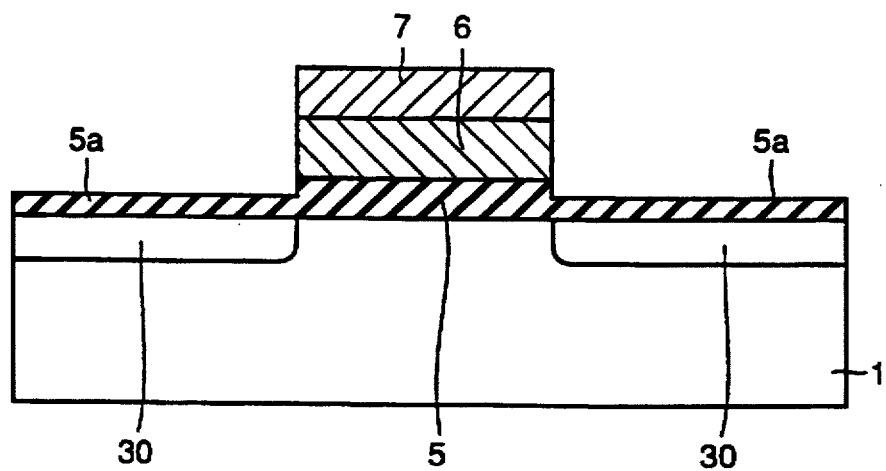
Figure 27:
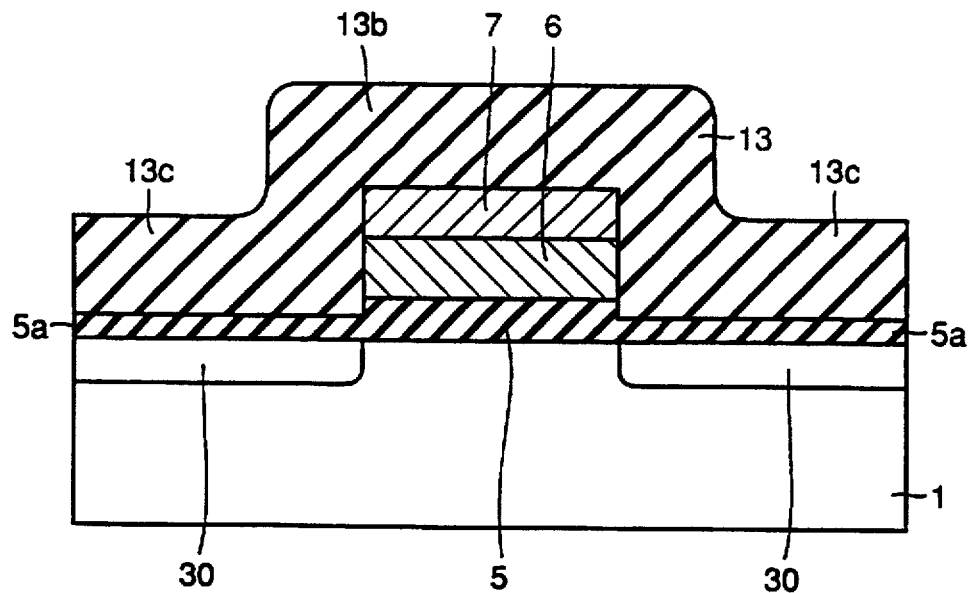
Figure 28:
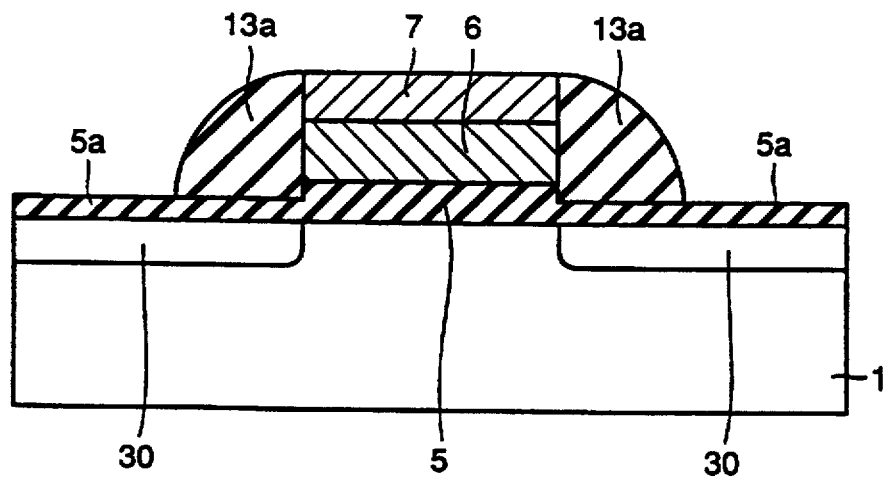
Figure 29:
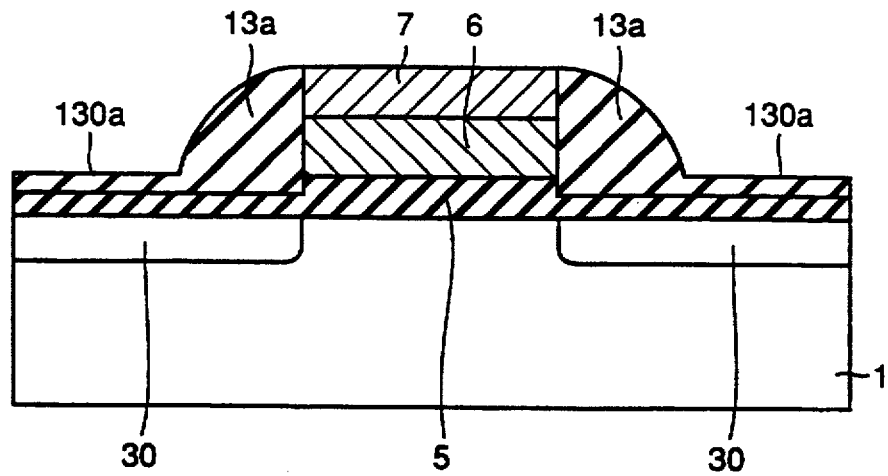
Figure 30:
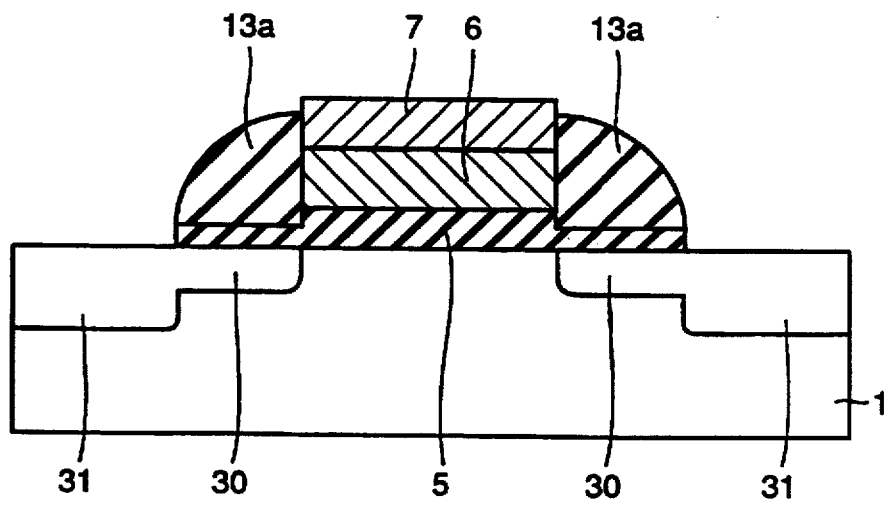
Figure 31:
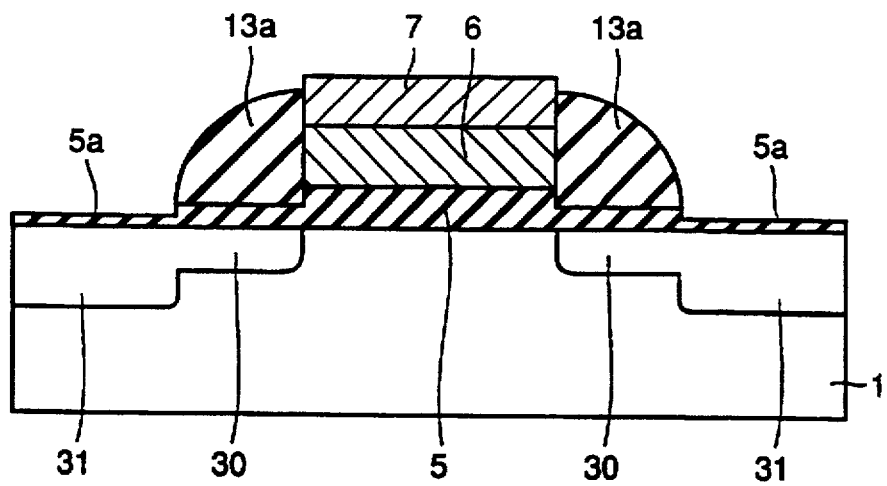
Figure 32:
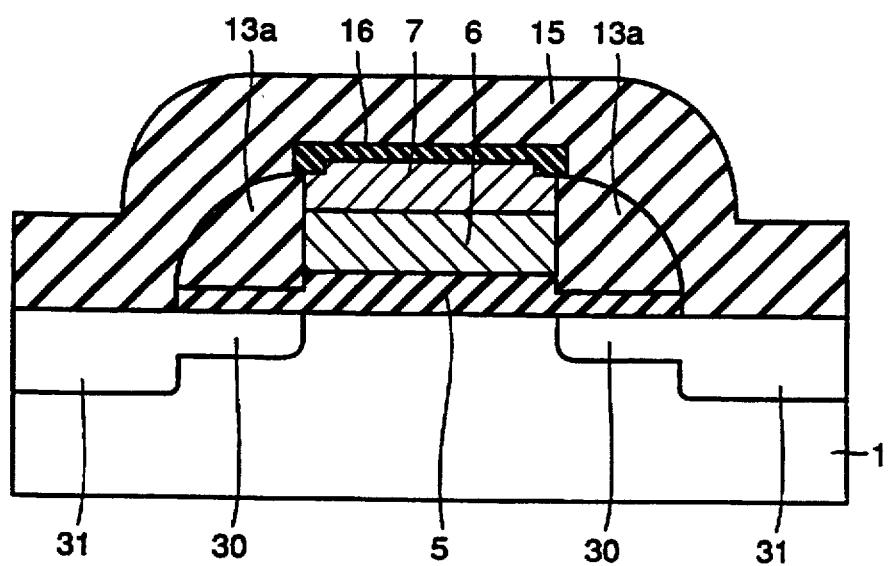
Figure 33:
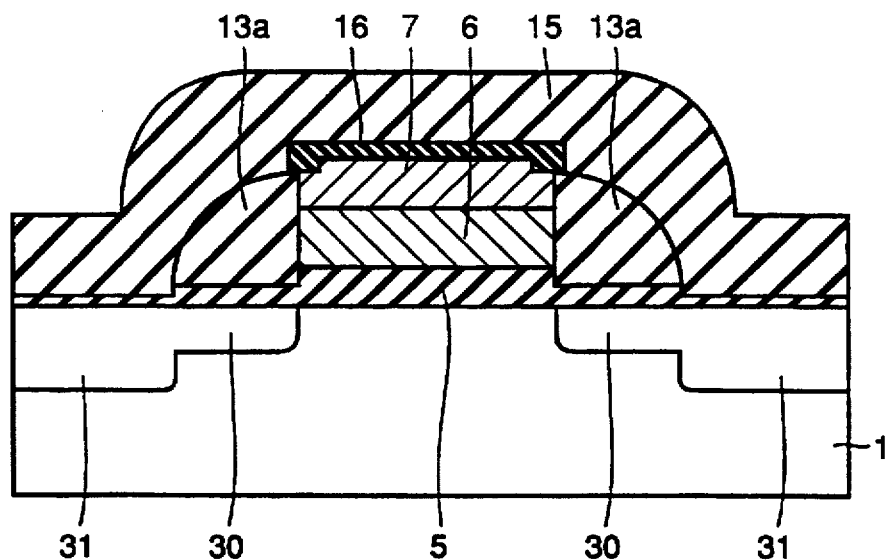

Using resist pattern 23 not having a notch configuration as a mask, anisotropic etching is effected on amorphous silicon layer 22, $WSi_2$ layer 21 and polycrystalline silicon layer 20, so that amorphous silicon layer 22, $WSi_2$ layer 21 and polycrystalline silicon layer 20 can have the pattern configuration not having the notch configuration as shown in FIGS. 16 and 18. Thereby, the interconnection layer of a three-layer structure accurately having the pattern configuration of design sizes can be formed easily.

According to the semiconductor device of one aspect of the invention, the upper layer, which is formed of one layer selected from the group consisting of the amorphous silicon layer, polycrystalline silicon layer, TiN layer and TiW layer having a low reflectivity, is formed on the high-melting-point metal silicide layer of the polycide structure formed on the stepped portion, so that halation at the stepped portion during formation of the resist pattern can be effectively prevented. Consequently, the good resist pattern without the notch configuration can be formed accurately in accordance with design size. Therefore, the interconnection layer or gate electrode structure accurately having the designed pattern configuration can be formed by the patterning of the lower layer with the above resist pattern.

According to the semiconductor device of another aspect of the invention, the upper layer, which is formed of one layer selected from the group consisting of the amorphous silicon layer, polycrystalline silicon layer, TiN layer and TiW layer, is formed on the high-melting-point metal silicide layer of the polycide structure, so that it is possible to prevent oxidation of the upper surface of the high-melting-point metal silicide layer by Oxygen carried to the inside of the CVD furnace from the outside during formation of the interlayer insulating film on the gate electrode. Thereby, it is possible to prevent formation of the oxide layer at the upper surface of the high-melting-point metal silicide layer, and thus it is possible to prevent variation of the sheet resistance value of the high-melting-point metal silicide layer. Since the concavity is formed at the main surface of the semiconductor substrate located outside the end of the lower surface of the side wall insulating film, the oxide film does not remain at any position on the whole substrate surface. Consequently, ion implanting conditions for ion-implanting impurity into the substrate surface can be uniform. Therefore, a plurality of impurity regions having uniform characteristics can be formed easily throughout the semiconductor substrate surface.

According to the method of manufacturing the semiconductor device of still another aspect of the invention, the upper layer, which is formed of one layer selected from the group consisting of the amorphous silicon layer, polycrystalline silicon layer, TiN layer and TiW layer, is formed on the high-melting-point metal silicide layer forming the polycide structure and located on the stepped portion, and the resist is formed on the upper layer, so that reflection of light beams by the upper layer can be effectively prevented during exposure of the resist. Consequently, the resist pattern, which does not have the notch configuration but has the intended pattern configuration, can be formed. Therefore, the upper layer, silicide layer and polycrystalline silicon layer accurately having the designed pattern configuration can be formed by etching the upper layer, silicide layer and polycrystalline silicon layer using the resist pattern as a mask.

According to the method of manufacturing the semiconductor device of yet another aspect of the invention, the silicon layer is formed on the high-melting-point metal silicide layer having the polycide structure, and then the insulating film covering them is formed, so that it is possible to prevent effectively oxidation of the upper surface of the high-melting-point metal silicide layer during formation of the insulating film. Thereby, it is possible to prevent variation of the sheet resistance value of the high-melting-point metal silicide layer. The concavity is formed at the main surface of the semiconductor substrate by anisotropic etching during formation of the side wall insulating film, whereby the gate oxide film does not remain at any of regions for forming source/drain regions on the whole substrate surface. Thereby, conditions of ion implantation for forming the source/drain regions can be uniform in the whole semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a stepped portion formed on a semiconductor substrate;
    a first polycrystalline silicon layer having a first portion and a second portion located on and elevated by said stepped portion with respect to the first portion;
    a high-melting-point metal silicide layer formed on said first polycrystalline silicon layer; and
    an upper layer formed on said high-melting-point metal silicide layer and formed of one layer selected from the group consisting of an amorphous silicon layer, a polycrystalline silicon layer, a TiN layer and a TiW layer, wherein
    said first polycrystalline silicon layer, said high-melting-point metal silicide layer and said upper layer form a gate electrode layer of a three-layer structure,
    said stepped portion is located at a side end of an element isolating and insulating film formed on a main surface of said semiconductor substrate,
    a side wall insulating film is formed in contact with at least side surfaces of said polycrystalline silicon layer and said high-melting-point metal silicide layer in a section along a channel length direction of said gate electrode layer, and
    a concavity is formed in the main surface of said semiconductor substrate located outside said side wall insulating film.

2. The semiconductor device according to claim 1, wherein
    said first polycrystalline silicon layer, said high-melting-point metal silicide layer and said upper layer form an interconnection layer of a three-layer structure, and
    said stepped portion is located at a surface of insulating film covering a conductive layer formed on said semiconductor substrate.

3. The semiconductor device according to claim 1, wherein said first polycrystalline silicon layer contains impurity of a first conductivity type, said upper layer is an amorphous silicon layer or a polycrystalline silicon layer, and said upper layer contains impurity of the same first conductivity type as said first polycrystalline silicon layer.

4. The semiconductor device according to claim 1, wherein said first polycrystalline silicon layer has a thickness not smaller than that of said high-melting-point metal silicide layer.

5. A semiconductor device comprising:

a semiconductor substrate having a main surface;

a pair of source/drain regions formed on the main surface of said semiconductor substrate and spaced by a predetermined distance from each other to define a channel region therebetween;

a first polycrystalline silicon layer formed on said channel region with a gate insulating film therebetween;

a high-melting-point metal silicide layer formed on said first polycrystalline silicon layer;

an upper layer formed on said high-melting-point metal silicide layer and formed of one layer selected from the group consisting of an amorphous silicon layer, a TiN layer and a TiW layer;

a side wall insulating film formed in contact with at least side surfaces of said first polycrystalline silicon layer and said high-melting-point metal silicide layer; and a concavity formed in the main surface of said semiconductor substrate located outside an end of a lower surface of said side wall insulating film.

6. The semiconductor device according to claim 5, wherein said first polycrystalline silicon layer contains impurity of a first conductivity type, said upper layer is an amorphous silicon layer, and said upper layer contains impurity of the same first conductivity type as said polycrystalline silicon layer.

7. The semiconductor device according to claim 5, wherein said first polycrystalline silicon layer has a thickness not smaller than that of said high-melting-point metal silicide layer.

* * * * *